(12) United States Patent
Greco et al.

(10) Patent No.: US 6,486,406 B1
(45) Date of Patent: Nov. 26, 2002

(54) LATCHING APPARATUS AND METHOD FOR PROVIDING RADIAL ALIGNMENT OF A HOUSING MOUNTED ON A CIRCUIT BOARD

(75) Inventors: Gerald A. Greco, Elk Grove Village, IL (US); Kenneth S. Laughlin, Arlington Heights, IL (US); Philip A. Ravlin, Bartlett, IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/712,617

(22) Filed: Nov. 14, 2000

(51) Int. Cl.[7] ............................................. H01B 17/00
(52) U.S. Cl. .............................. 174/138 R; 174/138 D; 174/255; 174/138 E; 174/138 G; 174/166 S; 174/176; 361/758; 361/759; 361/770
(58) Field of Search ....................... 174/138 D, 138 R, 174/255, 138 E, 138 G, 166 S, 176; 361/758, 759, 770

(56) References Cited

U.S. PATENT DOCUMENTS

| | | | | |
|---|---|---|---|---|
| 3,723,943 A | * | 3/1973 | Hotze .................... | 339/17 CF |
| 3,805,212 A | * | 4/1974 | Landman et al. ....... | 339/17 CF |
| D278,143 S | | 3/1985 | Hill ....................... | D13/99 |
| 4,588,854 A | * | 5/1986 | Bailey et al. ........... | 174/52 R |
| 5,255,159 A | | 10/1993 | Seyk ...................... | 361/770 |
| 5,281,149 A | | 1/1994 | Petri ...................... | 439/66 |
| 5,489,219 A | * | 2/1996 | Fabian ................... | 439/567 |
| 5,520,551 A | * | 5/1996 | Broschard, III ........ | 439/567 |
| 5,535,100 A | * | 7/1996 | Lubahn et al. ......... | 361/801 |
| 5,917,701 A | * | 6/1999 | Solberg ................. | 361/704 |
| 6,058,579 A | | 5/2000 | Brocklesby et al. ... | 24/459 |
| 6,078,500 A | * | 6/2000 | Beaman et al. ........ | 361/704 |
| 6,201,697 B1 | * | 3/2001 | McCullough .......... | 361/704 |

* cited by examiner

*Primary Examiner*—Dean A. Reichard
*Assistant Examiner*—Jinhee J Lee
(74) *Attorney, Agent, or Firm*—Baniak Pine & Gannon

(57) ABSTRACT

An apparatus and method for providing radial alignment of a housing mounted on a circuit board is provided. A mounting leg portion extends outward from a mounting surface of the housing. The mounting leg portion has a body portion, an end portion, and a radial alignment portion. The radial alignment portion extends outward from the mounting surface. The radial alignment portion has a circumference, and is adapted to be received in a mounting opening formed in the circuit board. The radial alignment portion prevents radial movement of the mounting leg portion with respect to the circuit board. The end portion of the mounting leg portion includes a snap portion for engaging the circuit board and securing the mounting leg portion to the circuit board.

21 Claims, 3 Drawing Sheets

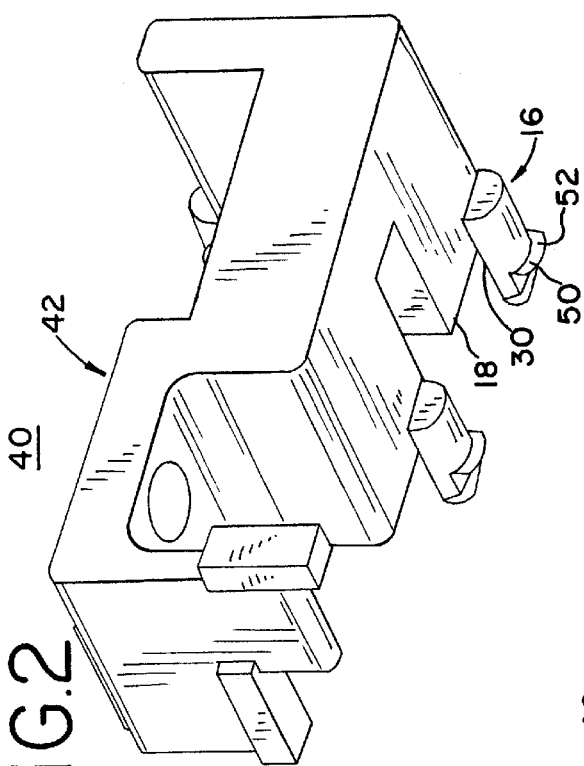
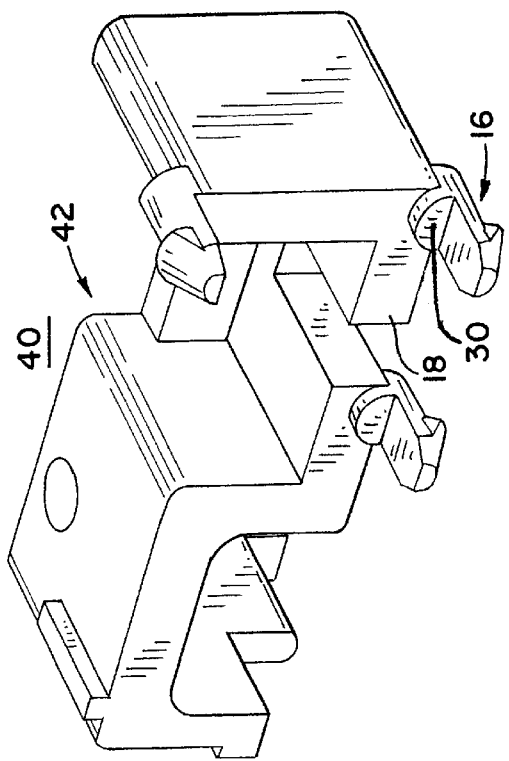
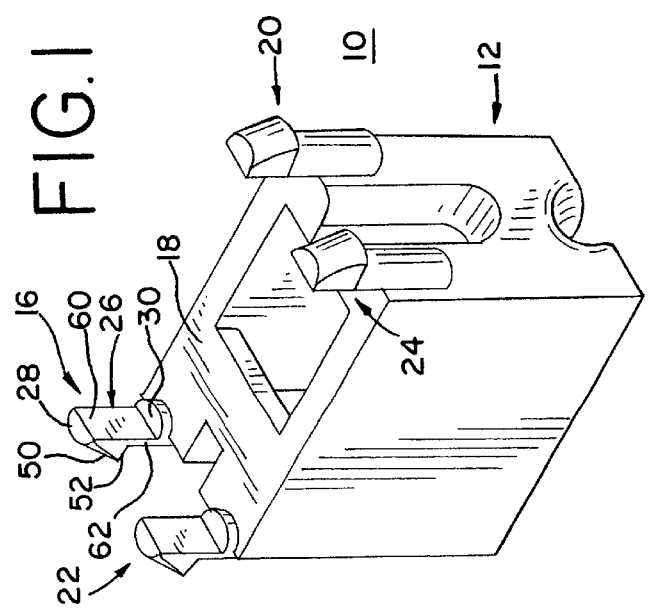

LATCHING APPARATUS AND METHOD FOR PROVIDING RADIAL ALIGNMENT OF A HOUSING MOUNTED ON A CIRCUIT BOARD

FIELD OF THE INVENTION

This invention relates generally to the field of mechanical fasteners for printed circuit board applications and, in particular, to a latching apparatus and method for providing radial alignment of a housing mounted on a printed circuit board.

BACKGROUND OF THE INVENTION

Many types of electronic devices typically include conventional printed circuit boards. Oftentimes, connectors having plastic housings need to be mechanically fastened to the circuit board. Because the various connectors are oftentimes very small, and because of the limited space on the printed circuit board, the precise alignment of these plastic housings on the circuit board is oftentimes critical. Moreover, it is equally important that the housings be securely fastened to the circuit board so that the housings remain in place when subjected to lateral forces.

Conventional connector housings typically include one or more plastic snap leg latches that extend through openings in the circuit boards. The snap leg latches may include a head portion that engages the circuit board thereby securing the housing to the circuit board. Examples of such snap leg latches are shown in FIGS. 1 and 2 of Des. Pat. No. 278,143 (see also, U.S. Pat. Nos. 5,281,149, 5,255,159, and 6,058, 579).

However, there are several disadvantages to these conventional snap leg latches. For example, when the snap leg latches are in the installed position, the cross section of the latches may only occupy approximately 60% of the receiving hole in the circuit board. The "open" space is typically required to provide the necessary clearance for the snap legs to enable the latch to operate. Because conventional snap leg latches typically occupy less than 100% of the volume of the receiving hole (see, for example, FIGS. 1 and 2 of Des. Pat. No. 278,143), they typically do not adequately prevent radial movement of the housing when lateral forces are applied to the housing. As a result, these conventional latches may result in the misalignment of connectors mounted on the circuit board.

Accordingly, it would be desirable to provide an apparatus and method of providing improved radial alignment of a housing mounted on a circuit board that overcomes the disadvantages described above.

SUMMARY OF THE INVENTION

One aspect of the invention provides a latching apparatus for providing radial alignment of a housing mounted on a circuit board. A mounting leg portion extends outward from a mounting surface of the housing. The mounting leg portion has a body portion, an end portion, and a radial alignment portion. The radial alignment portion extends outward from the mounting surface. The radial alignment portion has a circumference, and is adapted to be received in a mounting opening formed in the circuit board. The end portion of the mounting leg portion includes a snap portion for engaging the circuit board and securing the mounting leg portion to the circuit board. The radial alignment portion prevents radial movement of the mounting leg portion with respect to the circuit board. The circuit board may preferably include a first side and a back side, and the mounting surface of the housing may preferably contact the first side of the circuit board. The snap portion may preferably extend through the mounting opening. The snap portion may preferably include a flange portion for contacting the circuit board. The flange portion may preferably extend outward perpendicular to the body portion of the mounting leg portion. The mounting leg portion may preferably extend outward substantially perpendicular from the mounting surface of the housing. The body portion may preferably include a planar inner surface and a curved outer surface. The mounting leg portion may preferably be integrally formed with the housing. The mounting leg portion and the housing may each preferably be formed from plastic.

Another aspect of the invention provides a system for providing radial alignment including a housing mounted on a circuit board. The circuit board has a first side, a back side, and at least one mounting opening formed therein. The housing includes at least one mounting leg portion extending outward from a mounting surface of the housing. The at least one mounting leg portion has a body portion, an end portion, and a radial alignment portion. The radial alignment portion extends outward from the mounting surface. The radial alignment portion has a circumference. The radial alignment portion is received in the mounting opening. The end portion of the mounting leg portion includes a snap portion for engaging the circuit board and securing the mounting leg portion to the circuit board. The radial alignment portion prevents radial movement of the mounting leg portion with respect to the circuit board. The radial alignment portion may preferably be positioned between the first side of the circuit board and the back side of the circuit board. The mounting surface of the housing may preferably contact the first side of the circuit board. The snap portion may preferably extend through the mounting opening. The snap portion may preferably include a flange portion for contacting the circuit board. The flange portion may preferably contact the back side of the circuit board. The at least one mounting leg portion may be two mounting leg portions, and the at least one mounting opening may be two mounting openings.

Another aspect of the invention provides a method of providing radial alignment of a housing mounted on a circuit board. A mounting leg portion extends outward from a mounting surface of the housing. The mounting leg portion has a body portion, an end portion, and a radial alignment portion. The radial alignment portion extends outward from the mounting surface. The radial alignment portion has a circumference, and the circuit board has a mounting opening formed therein. The radial alignment portion is positioned into the mounting opening, and radial movement of the mounting leg portion with respect to the circuit board is prevented. The circuit board may preferably include a first side and a back side. The mounting surface of the housing may preferably be contacted against the first side of the circuit board. The radial alignment portion may preferably be positioned between the first side of the circuit board and the back side of the circuit board. The end portion of the mounting leg portion may preferably include a snap portion. The snap portion may preferably be contacted against the circuit board, and the mounting leg portion may preferably be secured to the circuit board. The snap portion may preferably extend through the mounting opening.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 is a perspective view of a latching apparatus for providing radial alignment that is made in accordance with the invention;

FIG. 2 is an alternative embodiment of a latching apparatus for providing radial alignment that is made in accordance with the invention;

FIG. 3 is embodiment of FIG. 2 showing further details of the apparatus;

DETAILED DESCRIPTION OF THE PRESENTLY PREFERRED EMBODIMENTS

Figure 4:
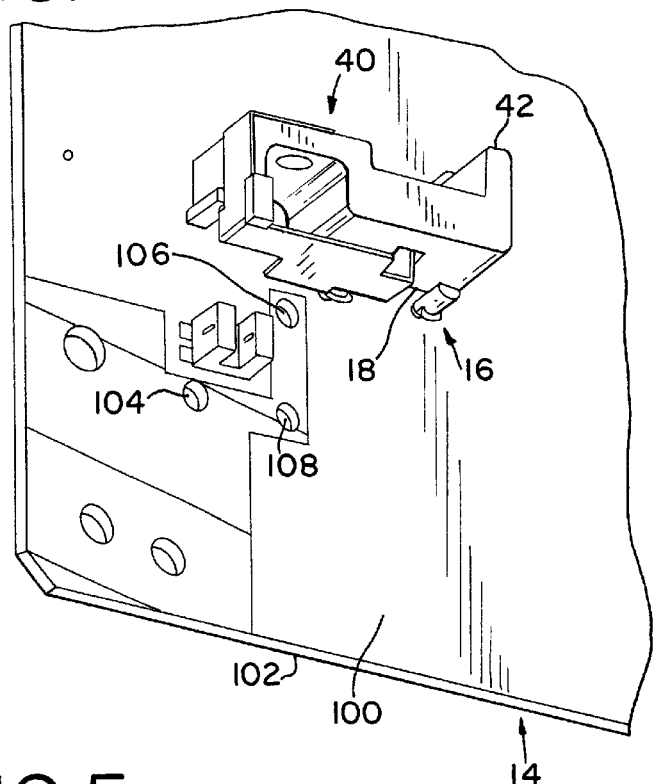
FIG. 4 is a perspective view of the latching apparatus of FIG. 2 shown exploded from a circuit board.

As shown in FIG. 1, a preferred embodiment of a latching apparatus 10 for providing radial alignment of a housing 12 is provided. The housing 12 may preferably be mounted on a circuit board such as the circuit board 14 shown in FIGS. 4–7. Those of ordinary skill in the art will appreciate that the shape and configuration of the housing 12 may vary depending upon the particular application. Referring to FIGS. 4–7, the circuit board 14 may preferably be a planar member and may preferably include a first side 100, a back side 102, and a plurality of mounting openings 104, 106, 108 formed therein. The circuit board 14 may preferably be any conventional printed circuit board.

Referring again to FIG. 1, a mounting leg portion 16 extends outward from a mounting surface 18 of the housing 12. In the embodiment shown, four mounting leg portions 16, 20, 22, and 24 are provided, although the number of mounting leg portions for the housing 12 may vary depending upon the particular application. The mounting leg portion 16 has a body portion 26, an end portion 28, and a radial alignment portion 30. The radial alignment portion 30 extends outward from the mounting surface 18 of the housing 12. The radial alignment portion 30 has a circumference, and is adapted to be received in one of the mounting openings (see, for example, openings 104, 106, and 108 in FIGS. 4–5) in the circuit board 14 (see FIGS. 4–5).

FIGS. 2–7 show an alternative embodiment of a latching apparatus 40 for providing radial alignment that is made in accordance with the invention. Referring to FIGS. 2–7, the housing 42 has a different shape than the housing 12 shown in FIG. 1. However, the mounting leg portion 16 shown in FIGS. 2–7 has the same configuration as the mounting leg portion 16 in FIG. 1. When the latching apparatus 40 is mounted onto the circuit board 14 (see FIGS. 4–7), the radial alignment portion 30 is positioned between the first side 100 of the circuit board 14 and the back side 102 of the circuit board 14. In the embodiment shown in FIGS. 2–7, for example, the radial alignment portion 30 of the mounting leg portion 16 occupies 100% of the receiving mounting opening 108 in the circuit board 14. As a result, the radial alignment portion 30 provides proper alignment of the mounting leg portion 16 with respect the circuit board 14. More importantly, the radial alignment portion 30 prevents radial movement of the mounting leg portion 16 with respect to the circuit board 14. Referring to FIGS. 3–4 and FIGS. 5–7, when the radial alignment portion 30 is received in the mounting opening 108, the mounting surface 18 of the housing 42 contacts the first side 100 of the circuit board 14.

Figure 5:
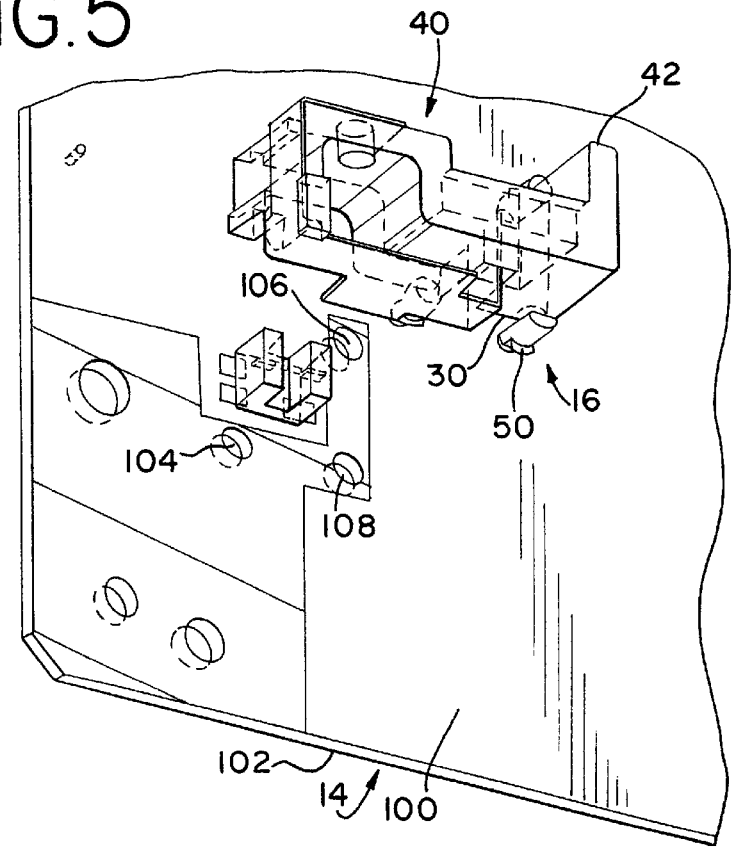
FIG. 5 is the embodiment of FIG. 4 showing further details of the apparatus.
Figure 6:
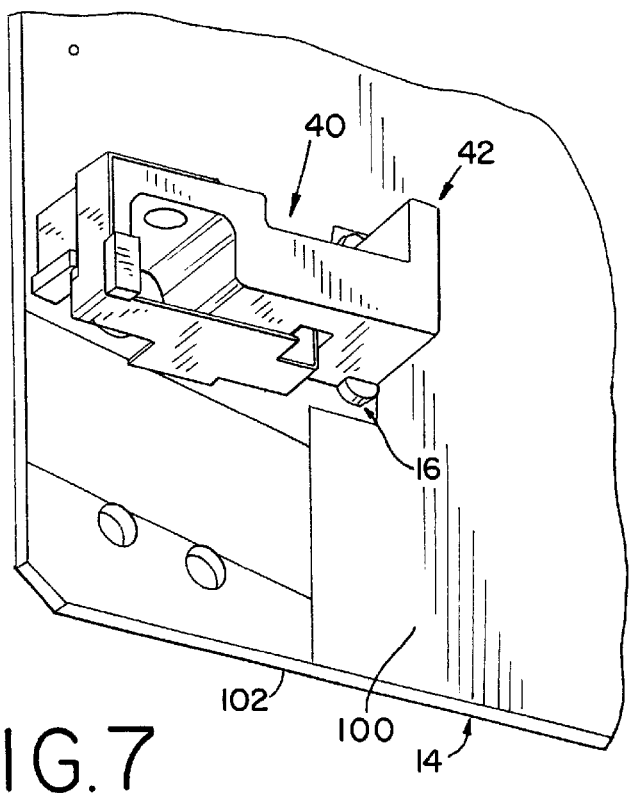
FIG. 6 is a perspective view of the latching apparatus of FIG. 2 shown mounted to the circuit board.
Figure 7:
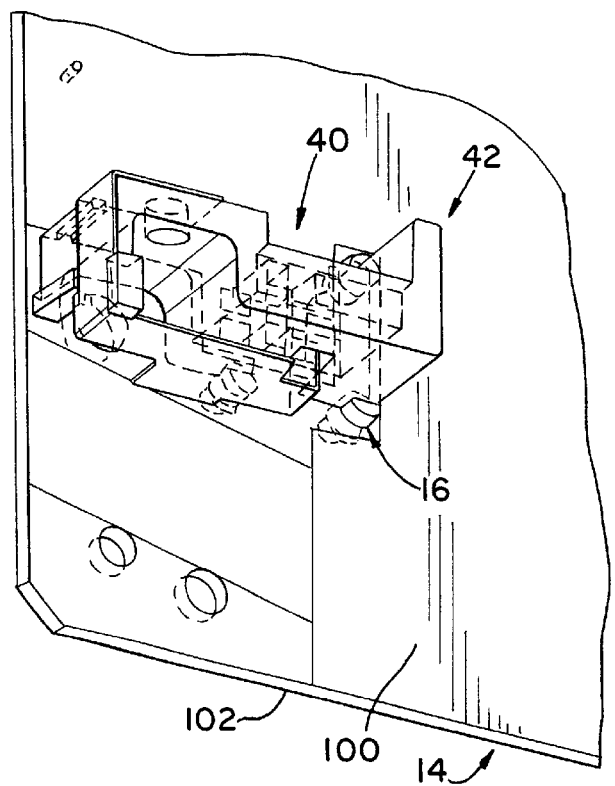
FIG. 7 is the embodiment of FIG. 6 showing further details of the apparatus.

Referring again to FIG. 1, the end portion 28 of the mounting leg portion 16 includes a snap portion 50 for engaging the circuit board 14 and securing the mounting leg portion 16 to the circuit board 14. The snap portion 50 may preferably extend through the mounting opening 108 as shown in FIG. 5. The shape and configuration of the snap portion 50 may vary depending upon the particular application. As shown in FIGS. 1 and 2, the snap portion 50 may preferably include a flange portion 52 for contacting the circuit board 14. As shown in FIG. 1, the flange portion 52 may preferably extend outward perpendicular to the body portion 26 of the mounting leg portion 16.

As shown in FIG. 1, mounting leg portion 16 may preferably extend outward substantially perpendicular from the mounting surface 18 of the housing 12. The mounting leg portion 16 may preferably be integrally formed with the housing 12. The mounting leg portion 16 may preferably be formed from any suitable flexible material such as, for example, plastic. The housing 12 may preferably be formed from any suitable rigid material such as, for example, ABS plastic. The body portion 26 of the mounting leg portion 16 may preferably include a planar inner surface 60 and a curved outer surface 62, although other shapes and configurations are contemplated.

In operation, and referring to FIGS. 4–5, a technician may align the housing 42 so that the mounting leg portion 16 is aligned with mounting opening 108 in the circuit board 14. The mounting leg portion 16 may then be positioned into and through the mounting opening 108. In particular, the snap portion 50 extends through the mounting opening 108, thereby deflecting the mounting leg portion 16. When the flange portion 52 (see FIG. 2) of the snap portion 50 extends beyond the back side 102 of the circuit board 14, the mounting leg portion 16 springs back to its original shape, and the flange portion 52 of the snap portion 50 contacts the back side 102 of the circuit board 14 thereby securing the mounting leg portion 16 (and thus the housing 42) to the circuit board 14. When the mounting leg portion 16 is in the fully inserted position (see FIG. 6), the mounting surface 18 of the housing 42 (see FIG. 2) contacts the first side 100 of the circuit board 14. The radial alignment portion 30 extending from the mounting surface 18 is thereby positioned in the mounting opening 108 between the first side 100 of the circuit board 14 and the back side 102 of the circuit board 14. The radial alignment portion 30 fills the mounting opening 108 100% thereby preventing radial movement of the mounting leg portion 16 with respect to the circuit board 14. The radial alignment portion 30 therefore maintains the radial alignment of the housing 42 with respect to the circuit board 14, which typically has strict dimensional requirements. The radial alignment portion 30 also reduces any radial stresses that may be placed on the housing 42.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A latching apparatus for providing radial alignment of a housing mounted on a circuit board comprising:

a mounting leg portion extending outward from a mounting surface of the housing, the mounting leg portion having a body portion, an end portion, and a radial alignment portion, the radial alignment portion extending outward from the mounting surface, the radial alignment portion having a circumference wherein the radial alignment portion is adapted to be received in a mounting opening formed in the circuit board, the end portion of the mounting leg portion including a snap portion for engaging the circuit board and securing the mounting leg portion to the circuit board, wherein the radial alignment portion prevents radial movement of the mounting leg portion with respect to the circuit board.

2. The latching mechanism of claim 1 wherein the circuit board includes a first side and a back side, the mounting surface of the housing contacting the first side of the circuit board.

3. The latching mechanism of claim 1 wherein the snap portion extends through the mounting opening.

4. The latching mechanism of claim 1 wherein the snap portion includes a flange portion for contacting the circuit board.

5. The latching mechanism of claim 4 wherein the flange portion extends outwardly, perpendicular to the body portion of the mounting leg portion.

6. The latching mechanism of claim 1 wherein the mounting leg portion extends outward substantially perpendicular from the mounting surface of the housing.

7. The latching mechanism of claim 1 wherein the body portion includes a planar inner surface and a curved outer surface.

8. The latching mechanism of claim 1 wherein the mounting leg portion is integrally formed with the housing.

9. The latching mechanism of claim 1 wherein the mounting leg portion and the housing are each formed from plastic.

10. A system for providing radial alignment comprising:

a housing mounted on a circuit board, the circuit board having a first side, a back side, and at least one mounting opening formed therein, the housing including at least one mounting leg portion extending outward from a mounting surface of the housing, the at least one mounting leg portion having a body portion, an end portion, and a radial alignment portion, the radial alignment portion extending outward from the mounting surface, the radial alignment portion having a circumference, the radial alignment portion received in the mounting opening, the end portion of the mounting leg portion including a snap portion for engaging the circuit board and securing the mounting leg portion to the circuit board, wherein the radial alignment portion prevents radial movement of the mounting leg portion with respect to the circuit board.

11. The system of claim 10 wherein the radial alignment portion is positioned between the first side of the circuit board and the back side of the circuit board.

12. The system of claim 10 wherein the mounting surface of the housing contacts the first side of the circuit board.

13. The system of claim 10 wherein the snap portion extends through the mounting opening.

14. The system of claim 10 wherein the snap portion includes a flange portion for contacting the circuit board.

15. The system of claim 14 wherein the flange portion contacts the back side of the circuit board.

16. The system of claim 10 where in the at least one mounting leg portion includes two mounting leg portions and the at least one mounting opening includes two mounting openings.

17. A method of providing radial alignment of a housing mounted on a circuit board comprising:

providing a mounting leg portion extending outward from a mounting surface of the housing, the mounting leg portion having a body portion, an end portion, and a radial alignment portion, the radial alignment portion extending outward from the mounting surface, the radial alignment portion having a circumference, a circuit board having a mounting opening formed therein, positioning the radial alignment portion into the mounting opening; and preventing radial movement of the mounting leg portion with respect to the circuit board.

18. The method of claim 17 wherein the circuit board includes a first side and a back side and further comprising:

contacting the mounting surface of the housing against the first side of the circuit board.

19. The method of claim 18 further comprising:

positioning the radial alignment portion between the first side of the circuit board and the back side of the circuit board.

20. The method of claim 17 wherein the end portion of the mounting leg portion includes a snap portion and further comprising:

contacting the snap portion against the circuit board, and securing the mounting leg portion to the circuit board.

21. The method of claim 17 wherein the snap portion extends through the mounting opening.

* * * * *